(12) United States Patent
Burkhardt et al.

(10) Patent No.: US 9,551,924 B2
(45) Date of Patent: Jan. 24, 2017

(54) STRUCTURE AND METHOD FOR FIXING PHASE EFFECTS ON EUV MASK

(71) Applicant: International Business Machines Corporation, Armonk, NY (US)

(72) Inventors: Martin Burkhardt, White Plains, NY (US); Emily Elizabeth Fisch Gallagher, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 63 days.

(21) Appl. No.: 14/620,843

(22) Filed: Feb. 12, 2015

(65) Prior Publication Data
US 2016/0238924 A1    Aug. 18, 2016

(51) Int. Cl.
G03F 1/24    (2012.01)
G03F 1/22    (2012.01)
G03F 1/26    (2012.01)
G03F 1/80    (2012.01)

(52) U.S. Cl.
CPC . *G03F 1/24* (2013.01); *G03F 1/26* (2013.01); *G03F 1/80* (2013.01)

(58) Field of Classification Search
CPC ..................................... G03F 1/24; G03F 1/22
USPC .............................................................. 430/5
See application file for complete search history.

(56) References Cited

U.S. PATENT DOCUMENTS

| | | | |
|---|---|---|---|
| 5,928,817 A | 7/1999 | Yan et al. | |
| 5,935,733 A * | 8/1999 | Scott | B82Y 10/00 430/5 |
| 5,935,737 A | 8/1999 | Yan | |
| 6,818,357 B2 | 11/2004 | Yan | |
| 6,841,309 B1 | 1/2005 | Alpay et al. | |
| 7,078,134 B2 | 7/2006 | Wurm et al. | |
| 8,137,869 B2 | 3/2012 | Bakker | |
| 8,142,958 B2 | 3/2012 | Holfeld | |
| 8,475,977 B2 | 7/2013 | Deweerd | |

(Continued)

OTHER PUBLICATIONS

Krautschik, C. et al.—"The Impact of the EUV Mask Phase Response on the Asymmetry of Bossung Curves as Predicted by Rigorous EUV Mask Simulations"—Proc. of SPIE, vol. 4343, 2001, pp. 392-401.

(Continued)

*Primary Examiner* — Stephen Rosasco
(74) *Attorney, Agent, or Firm* — Cantor Colburn LLP; Steve Meyers

(57) ABSTRACT

This invention relates to a structure for fixing phase effects on EUV mask which contains a repeating pattern with an assist feature, or a pattern with two different sized features in close proximity. The EUV mask with the repeating pattern is capable of printing a group of trenches on a photoresist layer. The invention also relates to a method of fabricating an EUV mask for fixing phase effects. The EUV mask contains an absorber layer over the multilayer reflector, and the absorber layer is patterned to form a mask pattern which contains absorptive regions and reflective regions. The absorber is in the absorptive regions, and a phase shifter is deposited at least in the whole reflective regions of the mask pattern to a thickness capable of correcting phase effects. The phase shifter has an index of refraction value is about equal to or less than that of the absorber. The thickness of the phase shifter is determined by simulation.

20 Claims, 10 Drawing Sheets

(56) References Cited

U.S. PATENT DOCUMENTS

2003/0027053 A1* 2/2003 Yan .................... B82Y 10/00
430/5
2014/0272678 A1 9/2014 Shih et al.

OTHER PUBLICATIONS

Yan, P.—"Study of Dark Field EUVL Mask for 45nm Technology Node Poly Layer Printing"—Proc. of SPIE, vol. 4889, 2002, pp. 1106-1112.
Erdmann, A. et al.—"Mask-topography-induced Phase Effects and Wave Aberrations in Optical and Extreme Ultraviolet Lithography"—Journal of Vacuum Science & Technology B, vol. 28, No. 6, 2010, pp. C6J1-C6J7.
Li, J. et al.—"Robust Source and Mask Optimization Compensating for Mask Topography Effects in Computational Lithography"—Optics Express, vol. 22, No. 8, 2014, pp. 9471-9485.

* cited by examiner

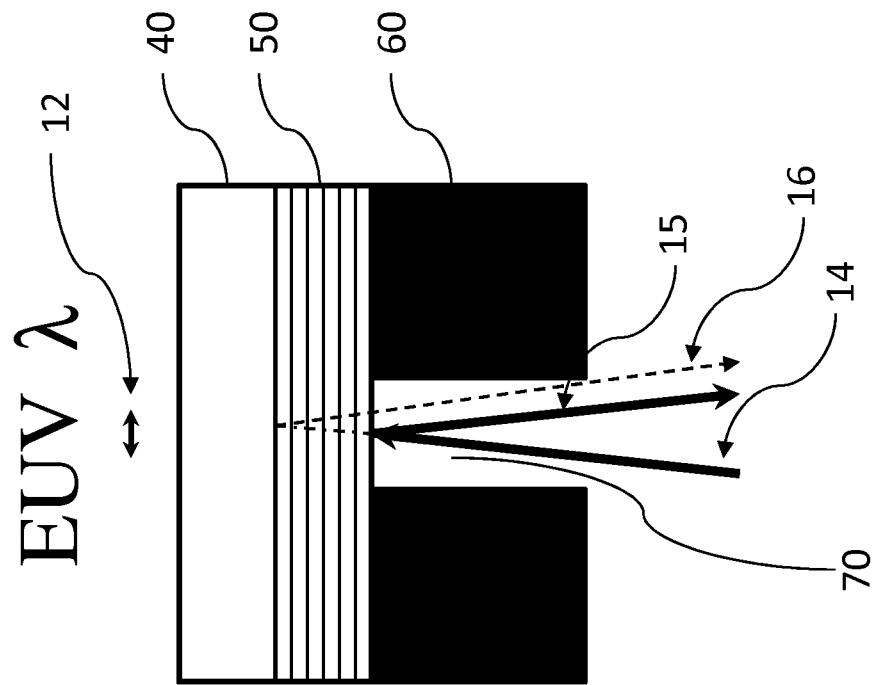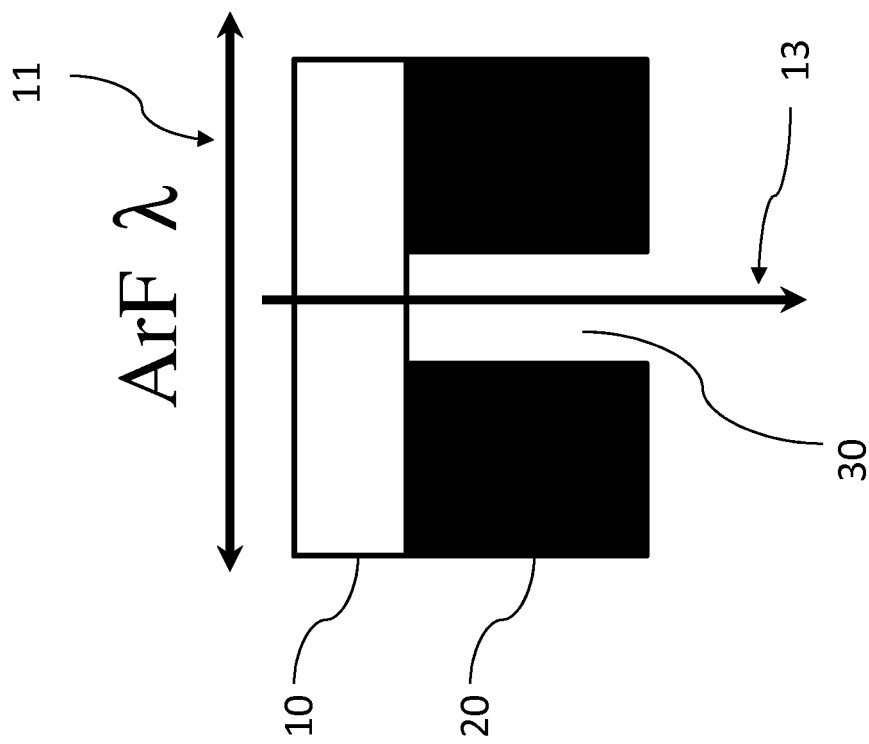
FIG. 1

STRUCTURE AND METHOD FOR FIXING PHASE EFFECTS ON EUV MASK

FIELD OF THE INVENTION

This invention relates generally to a structure and a method for fixing phase effects on EUV masks, and more particularly to a structure and a method for fixing phase effects on EUV masks containing a repeating pattern with an assist feature, or a pattern with mask openings of different sizes at close proximity.

BACKGROUND OF THE INVENTION

In the fabrication of integrated circuits, lithography is used to generate pattern structures on the semiconductor and various materials for the construction of the desired circuit structures. A continuing demand in view of the ever increasing desire in the semiconductor industry for higher circuit density in microelectronic devices has prompted lithographic engineers to develop improved lithographic processes. Especially, a lithographic process can provide improved linewidth control. In addition to the linewidth control, as the circuit density of semiconductor devices increases, higher resolution of circuit patterns in resist films is increasingly demanded. One way of improving the resolution in resist is to migrate to shorter wavelength from 365 nm to 248 nm, then to 193 and 157 nm, and further to extremely short optical wavelengths like EUV (extreme ultraviolet), or to adopt non optical system such as E-beam. The EUV lithography with exposure wavelengths below 40 nm would allow the industry to print features beyond the diffraction limit of the current 193 nm lithography without resorting to the adoption of tricks using double or triple patterning.

In the photolithographic exposure processes, patterns formed in a mask are projected onto the resist material. The EUV masks used are reflective and generally contain a substrate with a reflective multilayer deposited on it and a patterned absorbing layer deposited on the multilayer. Krautschik et al. in a 2001 SPIE paper (Proc. of SPIE, Vol. 4343, pp. 392-401, 2001) discuss the asymmetry of Bossung curves (linewidth vs. focus plot) and the shift in focus position in EUV lithography caused by the EUV mask. The focus shift was found to be pitch dependent. The focus shift is due to a phase error caused mainly by the interference of the reflected light from the reflective substrate with the diffracted light at the absorber edge or boundary and with the partially transmitted light from the absorber edge. However, Yan in a 2002 SPIE paper (Proc. of SPIE, Vol. 4889, pp. 1106-1112, 2002) concludes that a dark field mask or a space is insensitive to such a mask edge phase error.

It is found that a regular EUV mask containing assist features larger than the EUV wavelength causes an unwanted (but hard to avoid) phase shift present on the mask, which in turn causes focus variation at different pitches for a selected dimension in the printed photoresist images. Contrary to Yan's finding, the phase error occurs on the EUV mask with trench pattern containing an assist feature (a dark field mask). This phase error is caused by the difference in size of main and assist features and gets larger with closer proximity of the different sized features. Therefore, the EUV lithography requires a new structure on the mask to address this focus variation issue.

Depositing phase shifting material above multilayer reflector of an EUV mask to correct phase error has been reported previously. For example, Yan, in U.S. Pat. No. 6,818,357, teaches the use of a selected thin layer material with the thickness of the thin layer producing a phase correction that offsets a phase error such that a common process window of the mask is maintained above a threshold level. Yan also teaches that the mask includes a multilayer reflector and portions of the multilayer reflector are etched adjacent to features of the mask. The main teaching is to correct the phase shift using boundary patterning which is not easy to implement.

In addition, Holfeld, in U.S. Pat. No. 8,142,958, teaches a method which includes the steps of determining the position of a defect area of the substrate, in which a phase shift difference of an exposure radiation is caused by the defect, and depositing a phase-shifting material above the multilayer in one portion of the substrate, in which the portion at least partially contains the defect area. The main teaching of Holfeld is to fix a defect in an EUV mask by depositing the phase shifter only to cover the area or near the area of the multilayer reflector containing the defect.

SUMMARY OF THE INVENTION

According to an aspect of the present invention, there is provided an EUV mask for fixing phase effects containing: a mask substrate; a multilayer reflector on the mask substrate; a mask pattern over the multilayer reflector, the mask pattern contains absorptive regions and reflective regions, wherein the absorptive regions contain an absorber and the reflective regions contain openings created inside the mask pattern; and a phase shifter over the multilayer reflector, the phase shifter is deposited at least inside the openings in all the reflective regions of the mask pattern to a thickness capable of, during an EUV exposure process, correcting phase effects caused by a phase shift present on a mask. The phase shifter has an index of refraction value (real part of the refractive index) is about equal to or less than that of the absorber. The phase shifter over the multilayer reflector may be in both the reflective regions and the absorptive regions. In the absorptive regions, the phase shifter may be on top of the absorber.

The multilayer reflector may contain 40 layers of molybdenum (Mo) and silicon (Si) double layer, and the absorber may contain tantalum. The preferred absorber may contain tantalum nitride. The value of the real part of the refractive index of the phase shifter may be less than about 0.95, and preferably less than about 0.93. The value of the extinction coefficient (imaginary part of the refractive index) of the phase shifter may be less than about 0.03, and preferably less than about 0.02. The phase shifter may contain V, Nb, Mo, Tc, Rh, Ti, Ru, or mixtures thereof. The thickness of the phase shifter may be determined by simulation based on at least the mask pattern, the refractive index of the absorber, the refractive index of the phase shifter and thickness of the absorber. The EUV mask may contain a capping layer over the multilayer reflector. The capping layer may also be formed on top of the phase shifter, especially for an unstable phase shifter which is prone to oxidation. The preferred capping layer is Ru. Therefore, the EUV mask may contain a capping layer over both the multilayer reflector and the phase shifter.

The mask pattern of the EUV mask may contain a repeating pattern which contains an assist feature, or a pattern which contains two different sized features in close proximity. An EUV exposure of a photoresist layer on a semiconductor substrate under the repeating pattern in the EUV mask results in a printed photoresist pattern selected from a group consisting of lines, trenches, holes, studs, and mixtures thereof. The repeating pattern of the EUV mask causes the creation of the printed photoresist pattern. The preferred photoresist pattern is trenches. The photoresist may be positive tone or negative tone. For negative tone photoresist, the preferred photoresist pattern is lines. The assist feature generally has a linewidth (or spacewidth) in a range from about 20 nm to about 60 nm in the EUV mask, which corresponds to a range from about 5 nm to about 15 nm on the printed photoresist pattern. The assist feature is generally not printed on the photoresist pattern. The photoresist layer used in EUV lithography generally has a thickness in a range from about 10 nm to about 40 nm.

According to another aspect of the present invention, there is provided a method of making an EUV mask for fixing phase effects containing: providing a mask substrate; forming a multilayer reflector on the mask substrate; forming an absorber layer on the multilayer reflector; selectively etching the absorber layer to form a mask pattern which contains absorptive regions and reflective regions, wherein the reflective regions are regions where absorber of the absorber layer is etched away to form openings and the absorptive regions are regions where the absorber layer is not etched; depositing a phase shifter layer to cover at least all the reflective regions of the mask pattern to a thickness capable of, during an EUV exposure process, correcting phase effects caused by a phase shift present on a mask. In the method of making an EUV mask above, after forming the multilayer reflector and before forming the absorber layer may contain a step of forming a capping layer on top of the multilayer reflector. The capping layer may also be formed on top of the phase shifter layer after the step of forming the phase shifter layer. The phase shifter deposited has an index of refraction value (real part of the refractive index) about equal to or less than that of the absorber.

The multilayer reflector formed in the method of making an EUV mask may contain 40 layers of molybdenum (Mo) and silicon (Si) double layer. The absorber layer formed may contain tantalum. The preferred absorber layer may contain tantalum nitride. The phase shifter layer deposited may contain a material selected from a group consisting of V, Nb, Mo, Tc, Rh, Ti, Ru, and mixtures thereof. The thickness of the phase shifter layer may be determined by simulation based on at least the mask pattern, the refractive index of the absorber, the refractive index of the phase shifter and thickness of the absorber. The preferred capping layer is Ru.

The mask pattern of the EUV mask made with the above method may contain a repeating pattern which contains an assist feature, or a pattern which contains two different sized features in close proximity. An EUV exposure of a photoresist layer on a semiconductor substrate under the repeating pattern in the EUV mask results in a printed photoresist pattern selected from a group consisting of lines, trenches, holes, studs and mixtures thereof. The repeating pattern of the EUV mask causes the creation of the printed photoresist pattern. The preferred photoresist pattern is trenches. The photoresist may be positive tone or negative tone. For negative tone photoresist, the preferred photoresist pattern is lines. The assist feature generally has a linewidth in the range from about 20 nm to about 60 nm in the EUV mask, which corresponds to a range from about 5 nm to about 15 nm on the printed photoresist pattern. The assist feature is generally not printed on the photoresist pattern. The photoresist layer used in EUV lithography generally has a thickness in a range from about 10 nm to about 40 nm.

BRIEF DESCRIPTION OF THE DRAWINGS

FIG. 1 is a schematic cross-sectional diagram representing an assist feature on an ArF Mask and on an EUV mask according to one embodiment of the present invention. The drawing is approximately to scale, with the wavelength for ArF indicated with 11 and for EUV with 12. This shows that an ArF mask absorber can be considered 'thin' relative to the wavelength while for EUV the absorber is thick, giving rise to phase effects.

DETAILED DESCRIPTION OF PREFERRED EMBODIMENTS

Figure 2:
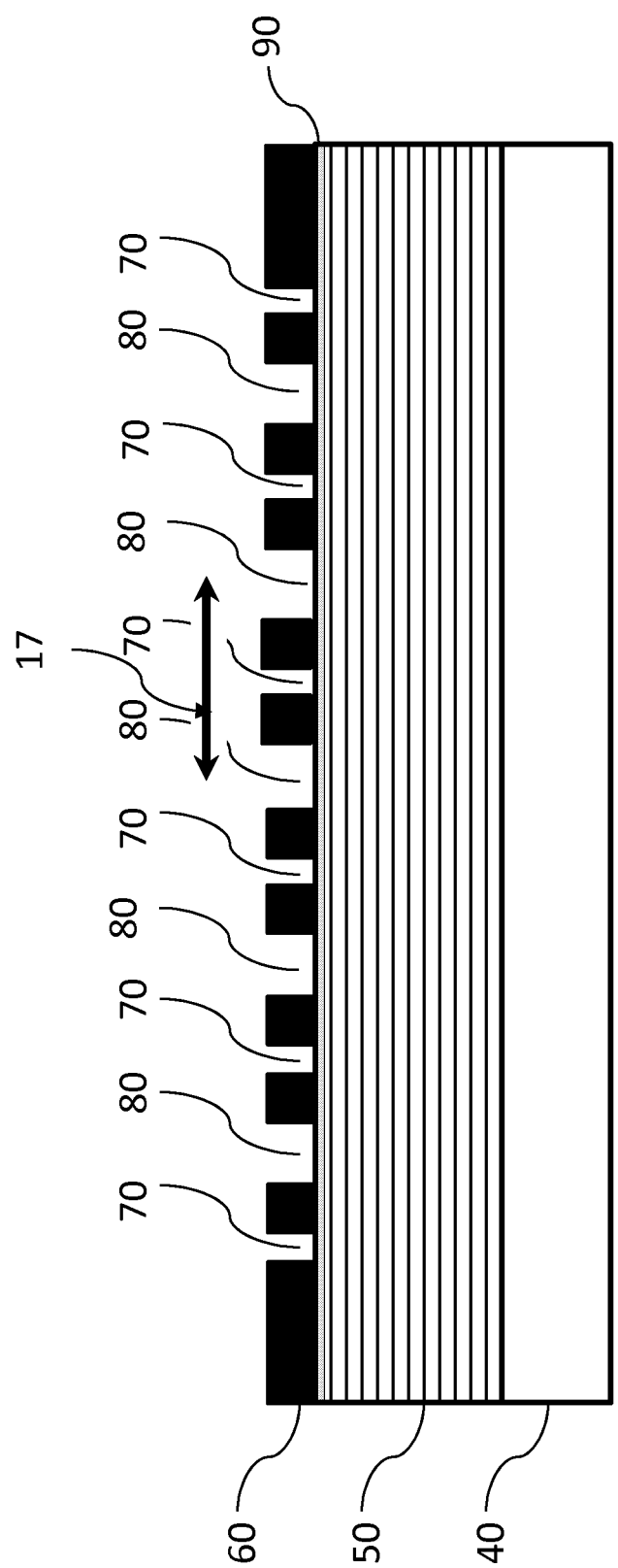
FIG. 2 is a schematic cross-sectional diagram representing a repeating pattern of trenches containing an assist feature on a mask for EUV lithography according to one embodiment of the present invention.

This invention relates to a structure for fixing phase effects on EUV masks. The invention also relates to a method of fabricating an EUV mask for fixing phase effects in EUV lithography. Especially, the structure and the method for fixing phase effects on EUV masks in this invention are applicable to a mask patterns containing a repeating pattern with an assist feature, or a pattern with two different sized features in close proximity.

To differentiate from regular X-ray, the EUV wavelength is usually referred to as being in a range from about 5 nm to about 40 nm. This range overlaps with the soft X-ray range which is generally in a range from about 2 nm to about 20 nm. The current EUV lithography uses an EUV source at around 11 nm to 14 nm, more specifically at 13.5 nm. Since the wavelength is much shorter than the current 193 nm optical system used in the industry, the potential advantage of being capable of resolving much smaller dimension of photoresist images should be realized with the adoption of this technology.

Referring to FIG. 1, the 193 nm (ArF wavelength) photolithography uses an imaging system which directs ArF radiation 13 through a mask to form a pattern, and then through a 4× (or 5×) demagnifying projection system projects the image of that pattern onto a photoresist layer on top of a semiconductor wafer. For an EUV lithographic system, the EUV radiation 14 is reflected from a mask to form a pattern, then the reflected radiation 15 and 16 containing the image information of that pattern is projected through a 4× demagnifying projection system onto a photo resist layer on top of a semiconductor wafer. The EUV mask is reflective, and since illumination and projection optics have to be separated spatially, the incident light and reflected light travel on a path that is not normal to the mask plane. The regular ArF mask contains a mask substrate 10 and an absorber 20, while the EUV mask contains a mask substrate 40, a multilayer reflector 50 and an absorber 60. The material for the ArF mask substrate 10 is usually high quality fused quartz, and the absorber 20 may be chromium or OMOG (opaque MoSi on glass). The material for the EUV mask substrate 40 is usually low thermal expansion quartz which may be doped with titania ($TiO_2$). The multilayer reflector 50 may contain 40 layers of molybdenum and silicon double layer. The surface of the multilayer reflector may contain a capping layer (not shown in FIG. 1) which is usually ruthenium. The absorber 60 is generally a tantalum based material and is optimized for 193 nm inspection and to reduce EMF (electromagnetic field) effect. It may be Ta, TaN or TaBN material. An exemplary assist feature (~40 nm here) size in the ArF lithography as shown in the mask opening 30 is much smaller than the ArF wavelength 11 (193 nm), while the same assist feature size in the EUV lithography as shown in the mask opening 70 is much larger than the EUV wavelength 12 (13.5 nm). An assist feature is a pattern on a mask that does not resolve during the exposure onto the wafer but assists in the printing of a main feature associated with it. This big difference between ArF lithography and EUV lithography results in different diffraction effect in the photolithographic process, especially when the masks have assist features. The assist feature generally has a linewidth (or trenchwidth) in a range from about 20 nm to about 60 nm in the EUV mask, which corresponds to a range from about 5 nm to about 15 nm on the printed photoresist pattern. The term "linewidth" represents the width of any feature not just of a line feature. For a line feature, it is the width of the line. For a trench feature, it is the width of the trench or space, and may be called spacewidth or trenchwidth. For a contact hole or stud feature, it is the diameter of the hole or stud. The feature includes main feature and assist feature. The assist feature is generally not printed on the photoresist pattern. Since the drawing in FIG. 1 is intended for illustrative purpose, the drawing is not necessarily drawn to scale. The drawing also only shows a few layers of the multilayer reflector, and does not show the entire 40 layers of the Mo—Si. The absorbers may contain ARC (antireflective layer), and the substrate may contain other layer or layers, such as CrON layer. These are not shown in the drawing in FIG. 1 either.

In addition to the absorber opening 70 being generally larger than the EUV wavelength 12 as shown in FIG. 1, the thickness of the absorber is also generally larger than both the opining 70 and the EUV wavelength 12. The opening 70 is in vacuum, thus the index of refraction (real part of the refractive index) $n_{vac}$ is 1 and the extinction coefficient (imaginary part of the refractive index) $k_{vac}$ is 0. The refractive index can be represented by the equation: n−ik. One exemplary absorber 60 currently used in the industry has the index of refraction nabs around 0.93, and has the extinction coefficient $k_{abs}$ around 0.044. The difference between $n_{vac}$ and nabs here is sufficient to cause a significant phase shift in close proximity to the absorber edge. For features of different size in close proximity, such as a main feature and an assist feature close together, the transmitted light in the main feature will then have a different phase relative to the phase of the assist feature. This causes a focus shift once an assist feature is introduced, and the focus shift is different between different pitches in the printed photoresist images. As long as two or more different sized features in close proximity will be sufficient to cause a significant phase shift, the features may not necessarily contain an assist feature and the pattern may not necessarily be a repeating pattern. The amount of focus drift may be different depending on illuminator. The exemplary illumination system may be a 25° or 45° quasar illumination system with $\sigma_{out}/\sigma_{in}$=088/0.37. Other illumination condition may be used. The current EUV stepper has a numerical aperture (NA) of 0.33. Higher NA is expected to provide better resolution for printing resist images. The present invention provides an EUV mask structure and a method of fabricating the EUV mask to address this focus drift issue, i.e. to fix this phase effects on EUV masks.

The structure and method for fixing phase effects on EUV mask in the present invention may be used to fix any phase effects on EUV mask. The phase effects in the present invention are generally referring to the effects of the phase shift or phase error caused by the interference of the reflected light from the reflective substrate with the diffracted light from the absorber. The results of these phase effects are the asymmetry of Bossung curves and the shift in focus position in EUV lithography caused by the EUV mask. The plot of linewidth vs. focus for a set of doses is usually called Bossung Plot (or Bossung curve). In 1977, J. W. Bossung first described a plotting method to determine the best focus and exposure dose (which he called exposure energy) for maintaining the Critical Dimensions (CDs) of printed patterns from lithography. Ever since then, Bossung Plots have been used to analyze the CD variation of a printed feature vs. the focus latitude and the exposure latitude. The Bossung Plot usually exhibits either "smile" (turn upward across focus positions) or "frown" (turn downward across focus positions), except at the isofocal dose, in which the curve is almost flat and relatively insensitive to changes in focus positions. The bottom of the smile or the top of the frown is the best focus position.

The present invention is particularly applicable to an EUV mask having a mask pattern containing a repeating pattern with an assist feature. The present invention is also applicable to an EUV mask having a pattern containing two different sized features in close proximity. An EUV exposure of a photoresist layer on a semiconductor substrate under the repeating pattern in the EUV mask results in a printed photoresist pattern. To obtain the printed photoresist pattern, the photoresist layer after exposure is generally baked and developed. The printed photoresist pattern may include different type of patterns such as lines, trenches, holes, studs or their combinations. The shape may also vary for the same type, for example a hole may be round, oval, square or rectangular. The repeating pattern may also contain mixtures of different types or shapes. The preferred repeating pattern for the present invention is a repeating pattern capable of printing a group of repeating trenches, i.e. gratings. The trenches may be vertical, horizontal or both. The photoresist layer used in EUV lithography generally has a thickness in a range from about 10 nm to about 40 nm. The photoresist may be a chemically amplified photoresist or a non-chemically amplified photoresist. The photoresist for EUV lithography may also be either positive tone or negative tone. The same EUV mask for printing trenches on positive tone resist will print lines on negative tone resist. The repeating pattern on the EUV mask for printing the trench gratings contains an assist feature. As shown in FIG. 2, a schematic cross-sectional diagram of an EUV mask for printing trenches, there are two assist feature openings 70 on each side of a main trench feature opening 80. In the printing process the assist feature will not be printed on the photoresist layer because the mask dimension is kept small enough not to resolve. The printed photoresist images may contain a group of repeating trenches with a pitch which is one fourth of the mask pitch 17 (the distance between two centers of two adjacent main feature openings). FIG. 2 only shows 5 trench sets of the repeating pattern of one pitch for illustrative purpose. The EUV mask used in an application may contain a set of pitches (different pitch size) with many trenches in each pitch. Besides the mask substrate 40, the multilayer reflector 50 and the absorber 60, FIG. 2 also shows a capping layer 90. A regular EUV mask is preferred to include a capping layer. Since the drawing in FIG. 2 is intended for illustrative purpose, the drawing is not necessarily drawn to scale. The drawing also only shows a few layers of the multilayer reflector, and does not show the entire 40 layers of the Mo—Si double layer.

One embodiment of the present invention includes an EUV mask structure for fixing phase effects containing a mask substrate, a multilayer reflector, a mask pattern having an absorber, and a phase shifter, wherein the phase shifter has an index of refraction smaller than that of the absorber. A layer of absorber material over the multilayer reflector is patterned to form the mask pattern which contains absorptive regions and reflective regions. The absorptive regions contain the absorber. The reflective regions contain openings created inside the mask pattern, and the openings are filled in with the phase shifter. The phase shifter has a thickness which is smaller than that of the absorber, and is capable of correcting phase effects.

Figure 3:
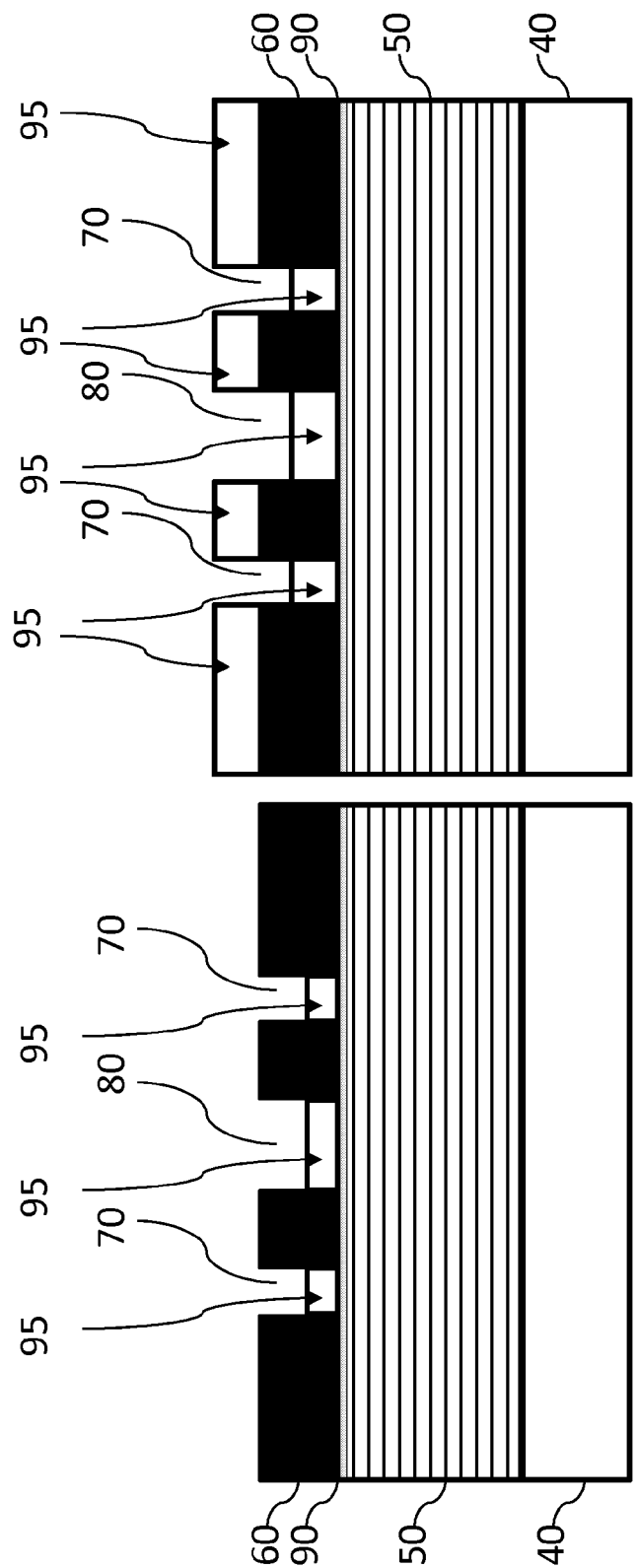
FIG. 3A and FIG. 3B are schematic cross-sectional diagrams representing EUV masks for fixing phase effects in EUV lithography with the real part of the refractive index of the phase shifter smaller than the real part of the refractive index of the absorber according to one embodiment of the present invention.

Referring to FIG. 3A, the EUV mask for fixing phase effects may contain a mask substrate 40, a multilayer reflector 50 on the mask substrate 40, an absorber 60 indirectly on the multilayer reflector 50, a capping layer 90 on the multilayer reflector and a phase shifter 95 which is only on top of the multilayer reflector 50 (directly on top of the capping layer 90) not on the absorber. The material for EUV mask substrate 40 may be any substrate which has low thermal expansion, such as ultralow expansion titanium silicate glass. The multilayer reflector 50 may contain 40 layers of molybdenum and silicon alternating double layer. Other materials may alternatively be used for the multilayer reflector 50, such as a Mo/Be multilayer stack, a Ru/Si multilayer stack, a Si/Mo/Ru multilayer stack, a Si/Mo/Sr multilayer stack, a Si/Mo/Ru/Mo multilayer stack, and a Si/Ru/Mo/Ru multilayer stack. The multilayer reflector 50 may contain from about 20 to about 80 layers of molybdenum and silicon alternating double layer. The thickness of the alternating layer may be in a range from about 2 nm to about 10 nm. One specific example, the alternating layers of Mo and Si with thickness of ~4.1 nm and ~2.8 nm respectively are deposited onto the mask substrate 40 to build up to 40 or more pairs each having thickness of ~6.9 nm (4.1+2.8) for 13.40 nm EUV wavelength operation. The total thickness of the multilayer reflector 50 may be in a range from about 50 nm to about 800 nm. The absorber 60 may contain a Ta based material such as Ta, TaN, TaBN, TaBON, or TaGeN. Other materials may be used for the absorber 60, such as Cr, $CrO_x$, Ge, Al, Al—Cu, $Al_2O_3$, Ti, TiN, SnTe, or ZnTe. The preferable absorbers are Ta, Cr and TaN. The more preferable absorber is TaN. The thickness of the absorber 60 may be in a range from about 30 nm to about 150 nm. On top of the multilayer reflector the stack may contain a capping layer 90 which is usually ruthenium. Other materials may be used for the capping layer 90, such as C, $C_2F_4$, SiC, SiB, $GeO_2$, $TiO_2$, $HfO_2$, $SiO_2$, B, BN, $B_4C$, $Si_3N_4$, TiN, Pd, Au, Ru, Rh, Cr or CrN. The thickness of the capping layer 90 may be in a range from about 0.5 nm to about 5 nm. In some instances, the EUV mask may further contain a conductive coating (not shown in FIG. 3A) formed on a back side of the substrate 40 to allow for electrostatic chucking. The conductive coating may contain Cr or CrN, or other suitable materials.

As shown in FIG. 3A, an originally formed absorber layer has been patterned to have absorptive regions which are the regions covered by the absorber 60, and reflective regions which are the regions covered by the openings of main feature 80 and assist feature 70. The reflective regions are deposited with a layer of phase shifter 95. The thickness of the phase shifter 95 is smaller than that of the absorber 60. For three chosen exemplary absorbers such as Ta, Cr and TaN, their indexes of refraction (real part of the refractive index) are 0.943, 0.932 and 0.925 according to tabulated data at an internet website. Since $n_{abs}$ is smaller than $n_{vac}$ here for any of these 3 absorbers, it requires a phase shifter having an index of refraction $n_{shi}$ which is smaller than that of the absorber to correct the phase error. The larger difference between $n_{abs}$ and $n_{shi}$ the better, because it requires thinner phase shifter. Because all the phase shifters generally have some absorption, a thin phase shifter is desirable to minimize the reduction of the intensity of the reflected EUV radiation. To minimize the absorption of EUV radiation, it is also desirable to have a phase shifter with low extinction coefficient $k_{shi}$. The thickness of the phase shifter may be determined with a simulation and can roughly be predicted. To predict the thickness that is required for the phase layer in FIG. 3A, we calculate first the phase shift that happens in close proximity to the absorber surface for the light traveling along the sidewalls on the edges of 70 and 80, which is roughly phi=$t_{abs}$/lambda*(1−$n_{abs}$), where phi is the introduced phase shift along the absorber edges, $t_{abs}$ t is the thickness of the absorber, and lambda is the wavelength of the EUV light. In the configuration of FIG. 3A, the layer 95 should introduce a similar phase shift to cancel this, which would happen at a thickness of $t_{shi}=t_{abs}*(1-n_{abs})/(1-n_{shi})$. Here, $t_{shi}$ is the thickness of the phase shifter. If, for example, the absorber thickness is 60 nm index of the absorber is $n_{abs}$=0.926 and the index of the shifter is $n_{shi}$=0.886 then the approximate thickness is about 39 nm. For FIG. 3B, we would have a similar number, except for the material that is deposited on the top of the absorber. In this case, we fine tune the required thickness using simulations, employing an industry standard simulation tool that can solve the electromagnetic fields for the geometries drawn in FIG. 3A or FIG. 3B. This simulator would first calculate the diffracted orders from the simulated mask, and then propagate them through the projection optics to predict the trenchwidth through focus. The shifter thickness that results in the least shift relative to the no assist feature case is the preferable shifter thickness to use. Besides thickness of the phase shifter, the input to the simulator may include at least the mask pattern, the refractive index of the absorber, the refractive index of the phase shifter, and thickness of the absorber. The preferable phase shifter has $n_{shi}$<0.943 and $k_{shi}$<0.03. Some exemplary phase shifter materials are Nb, Mo, Tc, Rh, Ru, and mixtures thereof.

The present invention is particularly applicable to an EUV mask having a mask pattern containing a repeating pattern with an assist feature. The printed photoresist pattern obtained through the exposure of a photoresist layer under the EUV mask containing the repeating pattern may include different types of patterns such as lines, trenches, holes, studs or their combinations. FIG. 3A represents a repeating pattern for printing trenches. The drawing is a schematic cross-sectional diagram of an EUV mask for printing trenches, and there are two assist feature openings 70 on each side of a main trench feature opening 80. In the printing process, the assist feature is generally not printed on the photoresist layer. The reflective region under openings 70 and 80 is deposited with a layer of phase shifter 95 which is capable of fixing phase effects on the EUV mask. Yan in a 2002 SPIE paper (Proc. of SPIE, Vol. 4889, pp. 1106-1112, 2002) concludes that a dark field mask or a space is insensitive to such a mask edge phase error. Contrary to Yan's finding, experimental and simulation results of embodiments of the present invention exhibit that a phase error occurs on the EUV mask with a repeating pattern containing an assist feature for printing trenches, i.e. a dark field EUV mask. Such a phase error can also occur for features of different geometrical extent that are in close proximity to each other. This may become more important as the resolution power of EUV projection tools gets better with higher numerical aperture lenses in the future. An EUV mask with a structure exhibited in FIG. 3A of the present invention provides a way to fix this phase error.

On top of the phase shifter 95 the stack may contain a capping layer (not shown in FIG. 3A). The capping layer may prevent any physical or chemical attack on the phase shifter. The relatively inert capping layer is generally used to prevent the oxidation of the layer directly underneath it. Therefore, the capping layer is required for relatively more reactive and unstable phase shifter materials. The capping layer may contain a material such as C, $C_2F_4$, SiC, SiB, $GeO_2$, $TiO_2$, $HfO_2$, $SiO_2$, B, BN, $B_4C$, $Si_3N_4$, TiN, Pd, Au, Ru, Rh, Cr or CrN. The thickness of the capping layer may be in the range from about 0.5 nm to about 5 nm. Since the capping layer will also affect the phase, if it is used, it is generally required to be incorporated in the simulation to determine the thickness of the phase shifter. For some instances, if it is too thin to affect the phase, or the index of refraction is so close to that of the vacuum, then it may not be necessary to incorporate it in the simulation.

Referring to FIG. 3B, the EUV mask for fixing phase effects may contain a mask substrate 40, a multilayer reflector 50 on the mask substrate 40, an absorber 60 indirectly on the multilayer reflector 50, a capping layer 90 on the multilayer reflector 50 and a phase shifter 95 which is on top of both the multilayer reflector 50 (directly on top of the capping layer 90) and the absorber 60. The EUV structure illustrated in FIG. 3B provides an alternative embodiment of the embodiment described in the previous sections for the EUV structure illustrated in FIG. 3A. The advantage of the structure illustrated in FIG. 3B is that it is relatively easier to fabricate the EUV mask for fixing phase effects with this structure in comparison to the structure illustrated in FIG. 3A. An EUV mask with the structure illustrated in FIG. 2 is blanket deposited with a layer of phase shifter would produce an EUV mask with the structure illustrated in FIG. 3B. The thickness of the phase shifter 95 on top of the absorber 60 is not necessary the same as the thickness of that on top of the multilayer reflector 50 (directly on top of the capping layer 90). It is preferable to have the same thickness of the phase shifter 95 on top of both the absorber 60 and the multilayer reflector 50 (directly on top of capping layer 90). The thickness of the phase shifter may be determined with a simulation. The parameters of the simulation need to include both the thickness of the phase shifter 95 on top of the absorber 60 and the thickness of the phase shifter 95 on top of the multilayer reflector 50 (directly on top of capping layer 90). On top of the phase shifter 95 the mask may contain a capping layer (not shown in FIG. 3B). Since the capping layer will also affect the phase, if it is used, it is generally required to be incorporated in the simulation to determine the thickness of the phase shifter. For some instances, if the capping layer is too thin to affect the phase, or its index of refraction is so close to that of the vacuum, then there may not be necessary to incorporate the thickness of the capping layer in the simulation. The simulation may require the incorporation of the mask pattern, the refractive indices of the absorber and the phase shifter, the thicknesses of the absorber and the phase shifter, and other necessary parameters.

The present invention described in the embodiment illustrated in FIG. 3B is particularly applicable to an EUV mask having a mask pattern containing a repeating pattern with an assist feature. The printed photoresist pattern obtained through the exposure of a photoresist layer under the EUV mask containing the repeating pattern may include different types of patterns such as lines, trenches, holes, studs, or their combinations. FIG. 3B represents a repeating pattern for printing tranches.

Another embodiment of the present invention includes an EUV mask structure for fixing phase effects containing a mask substrate, a multilayer reflector, a mask pattern having an absorber, and a phase shifter, wherein the phase shifter has an index of refraction about the same as the index of refraction of the absorber. A layer of absorber material over the multilayer reflector is patterned to form the mask pattern which contains absorptive regions and reflective regions. The absorptive regions contain the absorber. The reflective regions contain openings created inside the mask pattern, and the openings are filled in with the phase shifter. The phase shifter has a thickness about the same as that of the absorber. Alternatively, the phase shifter is deposited to form a planarized top surface on the EUV mask, in which the thickness of the phase shifter in the reflective region is larger than the thickness of the absorber, and the phase shifter covers both the reflective regions and the absorptive regions.

Figure 4:
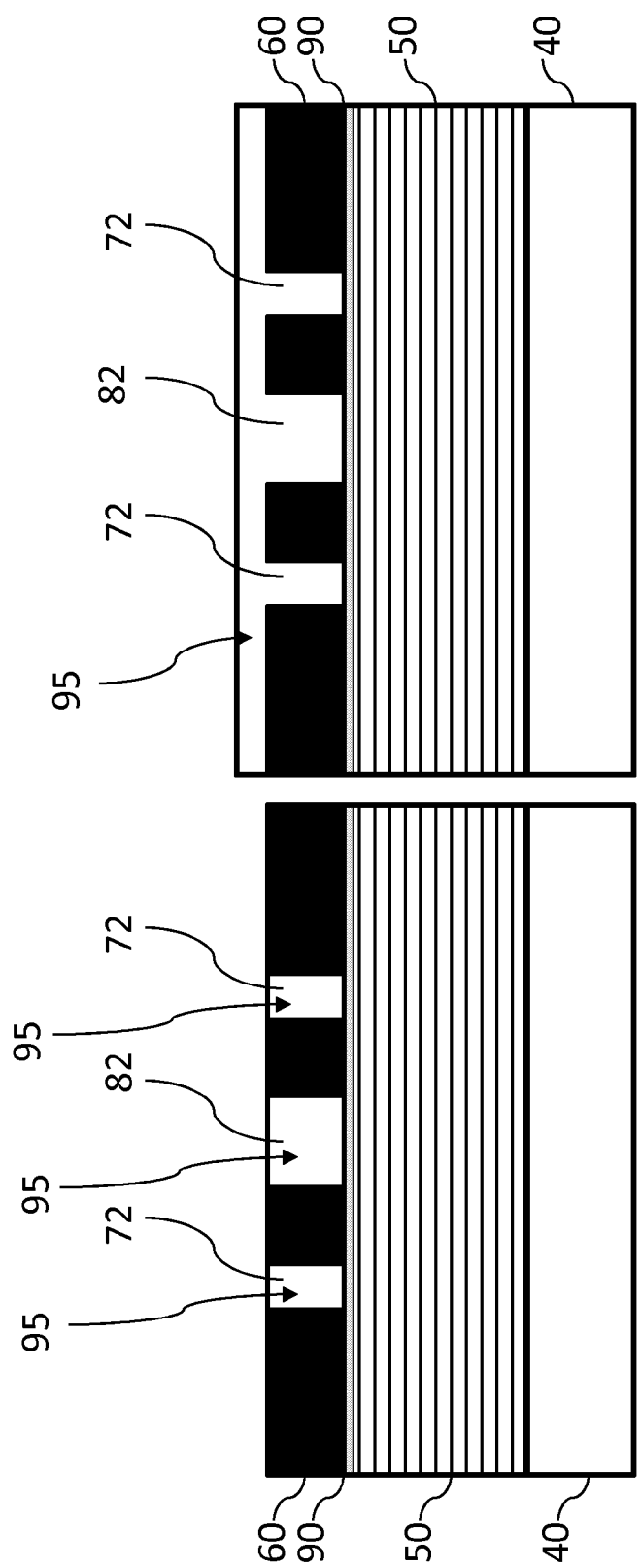
FIG. 4A and FIG. 4B are schematic cross-sectional diagrams representing EUV masks for fixing phase effects in EUV lithography with the real part of the refractive index of the phase shifter about the same as the real part of the refractive index of the absorber according to one embodiment of the present invention.

Referring to FIG. 4A, the EUV mask for fixing phase effects may contain a mask substrate 40, a multilayer reflector 50 on the mask substrate 40, an absorber 60 indirectly on the multilayer reflector 50, a capping layer 90 on the multilayer reflector 50 and a phase shifter 95 which is only on top of the multilayer reflector 50 (directly on top of the capping layer 90) not on the absorber, wherein the thickness of the phase shifter 95 is about the same as the absorber 60. An originally formed absorber layer has been patterned to have absorptive regions which are the regions covered by the absorber 60, and reflective regions which are the regions covered by the filled spaces of main feature 82 and filled spaces of assist feature 72. When the index of refraction of the absorber 60 is about the same as the index of the refraction of the phase shifter 95, the phase error will be very little. Therefore, it is not necessary to fix the phase effects by forming different thickness of the phase shifter 95 from the thickness of the absorber 60. The phase error has been eliminated or minimized by choosing about the same index of refraction of the absorber material and the phase shifter material. The choice of the absorber 60 may be any material having an index of refraction below 1. The choice of the phase shifter 95 may be any material having the same index of refraction about the same as that of the absorber 60 with low extinction coefficient. For two chosen exemplary absorber materials such as Ta and TaN, their indexes of refraction are 0.943 and 0.925. The choice of a phase shifter for Ta may have an index of refraction from about 0.94 to about 0.95. One exemplary phase shifter material suitable for the absorber Ta may be V which has $n_{shi}=\sim 0.943$ and $k_{shi}=\sim 0.025$. The choice of a phase shifter for TaN may have an index of refraction from about 0.92 to about 0.93. One exemplary phase shifter material suitable for the absorber TaN may be Mo which has $n_{shi}=\sim 0.924$ and $k_{shi}=\sim 0.0064$. On top of the phase shifter the stack may contain a capping layer (not shown in FIG. 4A). When Mo is chosen as the phase shifter, a capping layer directly on top of the phase shifter is preferred.

The present invention described in the embodiment illustrated in FIG. 4A is particularly applicable to an EUV mask having a mask pattern containing a repeating pattern with an assist feature. The printed photoresist pattern obtained through the exposure of a photoresist layer under the EUV mask containing the repeating pattern may include different type of patterns such as lines, trenches, holes, studs, or their combinations. FIG. 4A represents a repeating pattern for printing tranches. The present invention described in the embodiment illustrated in FIG. 4A is also applicable to an EUV mask having a pattern containing two different sized features in close proximity. In this case, as long as two or more different sized features in close proximity will be sufficient to cause a significant phase shift, the features may not necessarily contain an assist feature and the pattern may not necessarily be a repeating pattern.

Referring to FIG. 4B, the EUV mask for fixing phase effects may contain a mask substrate 40, a multilayer reflector 50 on the mask substrate 40, an absorber 60 indirectly on the multilayer reflector 50, a capping layer 90 on the multilayer reflector 50 and a phase shifter 95 which is on top of both the multilayer reflector 50 (directly on top of the capping layer 90) and the absorber 60. An originally formed absorber layer has been patterned to have absorptive regions which are the regions covered by the absorber 60, and reflective regions which are the regions covered by the filled spaces of main feature 82 and filled spaces of assist feature 72. The phase shifter has a planarized top surface on the EUV mask, in which the thickness of the phase shifter in the reflective region is larger than the thickness of the absorber, and the phase shifter covers both the reflective regions and the absorptive regions. The EUV structure illustrated in FIG. 4B provides an alternative embodiment of the embodiment described in the previous sections on the EUV structure illustrated in FIG. 4A. The advantage of the structure illustrated in FIG. 4B is that it is relatively easier to fabricate the EUV mask for fixing phase effects with this structure in comparison to the structure illustrated in FIG. 4A. Many deposition methods may create a planarized top surface. Even if the surface is not even, a chemical mechanical polishing process or an etch back process would provide a flat surface easier as shown in FIG. 4B than as shown in FIG. 4A. Although a flat top surface is preferred for both FIG. 4A and FIG. 4B, in some instances, non-flat top surface may also be applicable to our invention as long as the phase shifter is capable of fixing the phase effects. When the index of refraction of the absorber 60 is about the same as the index of the refraction of the phase shifter 95, the phase error will be very little. Therefore, it is not necessary to fix the phase effects by forming different thickness of the phase shifter 95 from the thickness of the absorber 60. The phase error has been eliminated or minimized by choosing about the same index of refraction of the absorber material and the phase shifter material. The extra thickness on both the absorptive regions and the reflective regions does not create any phase error. The choice of the absorber 60 may be any material having an index of refraction below 1. The choice of the phase shifter 95 may be any material having the same index of refraction about the same as that of the absorber 60 with low extinction frequency. Some exemplary material choices for absorber and phase shifter are described in the embodiment in the previous sections on the EUV structure illustrated in FIG. 4A. On top of the phase shifter the mask may contain a capping layer (not shown in FIG. 4B). When Mo is chosen as the phase shifter, a capping layer directly on top of the phase shifter is preferred.

The present invention described in the embodiment illustrated in FIG. 4B is particularly applicable to an EUV mask having a mask pattern containing a repeating pattern with an assist feature. The printed photoresist pattern obtained through the exposure of a photoresist layer under the EUV mask containing the repeating pattern may include different type of patterns such as lines, trenches, holes, studs, or their combinations. FIG. 4B represents a repeating pattern for printing trenches. The present invention described in the embodiment illustrated in FIG. 4B is also applicable to an EUV mask having a pattern containing two different sized features in close proximity. In this case, as long as two or more different sized features in close proximity will be sufficient to cause a significant phase shift, the features may not necessarily contain an assist feature and the pattern may not necessarily be a repeating pattern. Since the drawings in FIGS. 3A, 3B, 4A and 4B are intended for illustrative purpose, the drawings are not necessarily drawn to scale. The drawings also only show a few layers of the multilayer reflector, and do not show the entire 40 layers of the Mo—Si.

Yet another embodiment of the present invention includes a method of making an EUV mask for fixing phase effects. The method is described in the flow chart of FIG. 5. The method includes steps of: providing a mask substrate; forming a multilayer reflector on the mask substrate; forming an absorber layer on the multilayer reflector; selectively etching the absorber layer to form a mask pattern which contains absorptive regions and reflective regions; and depositing a phase shifting layer to cover the reflective regions of the mask pattern to a thickness capable of, during an EUV exposure process correcting phase effects caused by a phase shift present on a mask.

Figure 5:
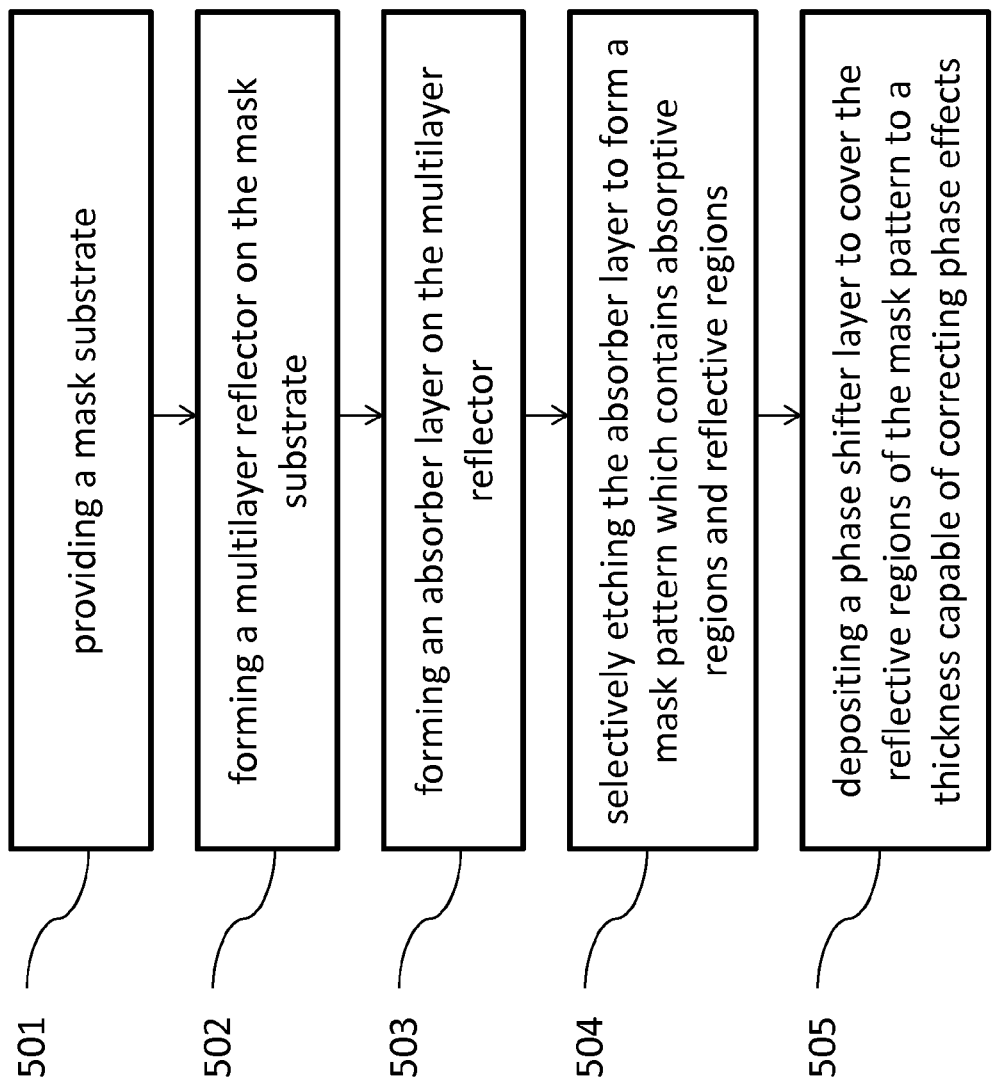
FIG. 5 is a flow chart of a method of making an EUV mask for fixing phase effects according to one embodiment of the present invention.

Referring to FIG. 5, as depicted in block 501, a mask substrate is provided. The mask substrate is selected to have a minimum image distortion from mask heating during an intensified EUV radiation. The material for EUV mask substrate may be any substrate which has low thermal expansion, such as ultralow expansion titanium silicate glass. At block 502 of FIG. 5, a multilayer reflector on the mask substrate is formed. The multilayer reflector may include alternating layers of two materials deposited on top of the EUV mask substrate to act as a Bragg reflector that maximizes the reflection of the EUV radiation. Various deposition processes can be used to form the multilayer reflector, which include but are not limited to: physical vapor deposition, chemical vapor deposition, and electrochemical deposition. The preferable deposition processes are E-beam deposition, magnetron sputtering, and ion beam sputtering. The multilayer reflector may contain 40 layers of molybdenum and silicon alternating double layer. Other materials may alternatively be used for the multilayer reflector, such as a Mo/Be multilayer stack, a Ru/Si multilayer stack, a Si/Mo/Ru multilayer stack, a Si/Mo/Sr multilayer stack, a Si/Mo/Ru/Mo multilayer stack, and a Si/Ru/Mo/Ru multilayer stack. The multilayer reflector may contain from about 20 to about 80 layers of molybdenum and silicon alternating double layer. The thickness of the alternating layers may be in a range from about 2 nm to about 10 nm. One specific example, the alternating layers of Mo and Si with thickness of ~4.1 nm and ~2.8 nm respectively are deposited onto mask substrate to build up to 40 or more pairs each having thickness of ~6.9 nm (4.1+2.8) for 13.40 nm EUV wavelength operation. The total thickness of the multilayer reflector may be in a range from about 50 nm to about 800 nm.

After forming the multilayer reflector on the mask substrate, the method of making an EUV mask for fixing phase effects may include a step of forming a capping layer above the multilayer reflector. The capping layer is relatively inert and may prevent any physical or chemical attack on the multilayer reflector while being sufficiently transmissive not to cause too much EUV attenuation. Various deposition processes can be used to form the capping layer, which include but are not limited to: physical vapor deposition, chemical vapor deposition and electrochemical deposition. The capping layer may contain a material such as C, $C_2F_4$, SiC, SiB, $GeO_2$, $TiO_2$, $HfO_2$, $SiO_2$, B, BN, $B_4C$, $Si_3N_4$, TiN, Pd, Au, Ru, Rh, Cr or CrN. The preferable material is Ru. The thickness of the capping layer may be in a range from about 0.5 nm to about 5 nm.

At block 503 of FIG. 5, an absorber layer on the multilayer reflector is formed. When a capping layer is formed on top of the multilayer reflector, the absorber layer is formed directly on top of the capping layer. Various deposition processes can be used to form the absorbing layer, which include but are not limited to: physical vapor deposition, chemical vapor deposition and electrochemical deposition. The absorber layer may contain a Ta based material such as Ta, TaN, TaBN, TaBON, or TaGeN. Other materials may be used for the absorber layer, such as Cr, $CrO_x$, Ge, Al, Al—Cu, $Al_2O_3$, Ti, TiN SnTe, or ZnTe. The preferable materials for absorber layer are Ta, Cr and TaN. The more preferable material for the absorber layer is TaN. The thickness of the absorber layer may be in a range from about 30 nm to about 150 nm.

At block 504 of FIG. 5, the absorber layer is selectively etched to form a mask pattern which contains absorptive regions and reflective regions. For the mask pattern, the reflective regions are regions where absorber of the absorber layer is etched away to form openings and the absorptive regions are regions where the absorber layer is not etched. The absorber layer may be etched with any suitable etching technique. In general, a photoresist layer is patterned on top of the absorber layer and that pattern is replicated into the absorber layer by etching the absorber layer in locations not covered by the photoresist layer to form the mask pattern, such as the patterned features shown in FIG. 2. The etching process is generally a process with reactive etching using proper etchant. Alternatively, the absorber layer with desired mask pattern is deposited on an EUV mask which has no absorber layer on top of the multilayer reflector (or the capping layer). Generally, a photoresist layer is patterned on top of the multilayer reflector (or the capping layer) and that pattern is replicated onto the multilayer reflector (or on the capping layer) by depositing the absorber in locations not covered by the photoresist layer to form the mask pattern, such as the patterned features shown in FIG. 2. Various deposition processes include but are not limited to: physical vapor deposition, chemical vapor deposition, and electrochemical deposition. After etching or depositing, the photoresist layer is then stripped with a method commonly known in the industry. The mask pattern contains a repeating pattern with an assist feature. The printed photoresist pattern obtained through the exposure of a photoresist layer under the EUV mask containing the repeating pattern may include different types of patterns such as lines, trenches, holes, studs, or their combinations. FIG. 2 represents a repeating pattern for printing trenches. The absorber 60 in FIG. 2 covers the absorptive regions. The openings or spaces such as the assist feature openings 70 and main feature openings 80 cover the reflective regions. The mask pattern described above may have a pattern containing two different sized features in close proximity. In this case, as long as two or more different sized features in close proximity will be sufficient to cause a significant phase shift, the features may not necessarily contain an assist feature and the pattern may not necessarily be a repeating pattern.

At block 505 of FIG. 5, a phase shifter layer is deposited on the patterned absorber layer to cover the reflective regions of the mask pattern to a thickness capable of correcting phase effects. The phase effects are caused by a phase shift present on a mask. The phase shifter is deposited inside the openings in all the reflective regions. Various deposition processes can be used to deposit the phase shifter layer, which include but are not limited to: physical vapor deposition, chemical vapor deposition and electrochemical deposition. The phase shifter material requires low extinction coefficient. The choice of the material for the phase shifter layer is also dependent on the choice of the material for the absorber layer. The index of refraction of the phase shifter material may be about the same or less than that of the absorber material. When the index of refraction of the phase shifter is smaller than that of the absorber, the phase shifter layer is deposited on the patterned absorber layer to form the EUV mask structures as shown in FIG. 3A and FIG. 3B. When the index of refraction of the phase shifter is about the same as that of the absorber, the phase shifter layer is deposited on the patterned absorber layer to form the EUV mask structures as shown in FIG. 4A and FIG. 4B. The thickness of the phase shifter layer is determined by simulation for FIGS. 3A and 3B. In this case, the required thickness is fine tuned using simulations, employing an industry standard simulation tool that can solve the electromagnetic fields for the geometries drawn in FIG. 3A or FIG. 3B. The phase shifter thickness that results in the least shift relative to the no assist feature case is the preferable phase shifter thickness to use. Besides thickness of the phase shifter, the input to the simulator may include at least the mask pattern, the refractive index of the absorber, the refractive index of the phase shifter, and thickness of the absorber.

For the method of fabricating EUV mask structures as shown in FIGS. 3A and 3B, because all the phase shifters generally have some absorption, a thin phase shifter is desirable to minimize the reduction of the intensity of the reflected EUV radiation. The larger difference between $n_{abs}$ and $n_{shi}$ the better, because it requires thinner phase shifter. To minimize the absorption of EUV radiation, it is also desirable to have a phase shifter with low extinction coefficient $k_{shi}$. For three chosen exemplary absorbers such as Ta, Cr and TaN, their indexes of refraction are 0.943, 0.932 and 0.925. The preferable phase shifter has $n_{shi}$<0.943 and $k_{shi}$<0.03. Some exemplary phase shifter materials are Nb, Mo, Tc, Rh, Ru, and mixtures thereof.

In FIGS. 4A and 4B, the phase error has been eliminated or minimized by choosing about the same index of refraction of the absorber material and the phase shifter material for the EUV mask. The choice of the phase shifter may be any material having the same index of refraction about the same as that of the absorber with low extinction coefficient. For two chosen exemplary absorber materials such as Ta and TaN, their indexes of refraction are 0.943 and 0.925. The choice of a phase shifter for Ta may have an index of refraction from about 0.94 to about 0.95. One exemplary phase shifter material suitable for the absorber Ta may be V which has $n_{shi}$~0.943 and $k_{shi}$=~0.025. The choice of a phase shifter for TaN may have an index of refraction from about 0.92 to about 0.93. One exemplary phase shifter material suitable for the absorber TaN may be Mo which has $n_{shi}$=~0.924 and $k_{shi}$=~0.0064.

For depositing a phase shifting layer to form the EUV mask structures for fixing phase effects as illustrated in FIGS. 3A and 4A, a photoresist layer is generally patterned on top of the patterned absorber layer to cover only the absorptive regions (on top of the absorber), and then the phase shifter layer is deposited in the reflective regions (the openings). Alternatively, a phase shifter layer is deposited to the whole regions including the absorptive regions and the reflective regions, and then a planarization layer is coated over the phase shifter layer followed by chemical mechanic polishing and then planarization layer stripping. It may also be followed by an etch back process and then a planarization layer strip process. For depositing a phase shifter layer to form the EUV mask structures for fixing phase effects as illustrated in FIG. 3B, physical vapor deposition such as sputtering method may deposit the same thickness of the phase shifter layer in the reflective regions and the absorptive regions. For depositing a phase shifter layer to form the EUV mask structures for fixing phase effects as illustrated in FIG. 4B, electrochemical deposition or chemical vapor deposition may be able to form a planarized top surface. A better approach is to deposit the phase shifter layer to all regions to a thickness larger than that of the absorber, and then the top surface is planarized through a chemical mechanical polishing process or an etch back process.

After depositing the phase shifter layer, the method of making an EUV mask for fixing phase effects may include a step of forming a capping layer above the phase shifter layer. The capping layer is relatively inert and may prevent any physical or chemical attack on the phase shifter layer. For the EUV mask structures for fixing phase effects as illustrated in FIGS. 3A and 3B, the capping layer will also affect the phase, so it is generally required to be incorporated in the simulation to determine the thickness of the phase shifter layer. For some instances, if the capping layer is too thin to affect the phase, or its index of refraction is so close to that of the vacuum, then it may not be necessary to incorporate the thickness of the capping layer in the simulation. The sequence of the steps in the flow chart in FIG. 5 is preferred. However, the invention is not limited to the performance of these steps with the sequence or order presented in this flow chart. Many steps may also be applied to the substrate before, between or after the steps shown in this flow chart.

Some specific examples are given below to illustrate the embodiments of the present invention. Since these examples are given for illustrative purpose only, the invention is not limited to the specific details of the examples.

EXAMPLE 1

Figure 6:
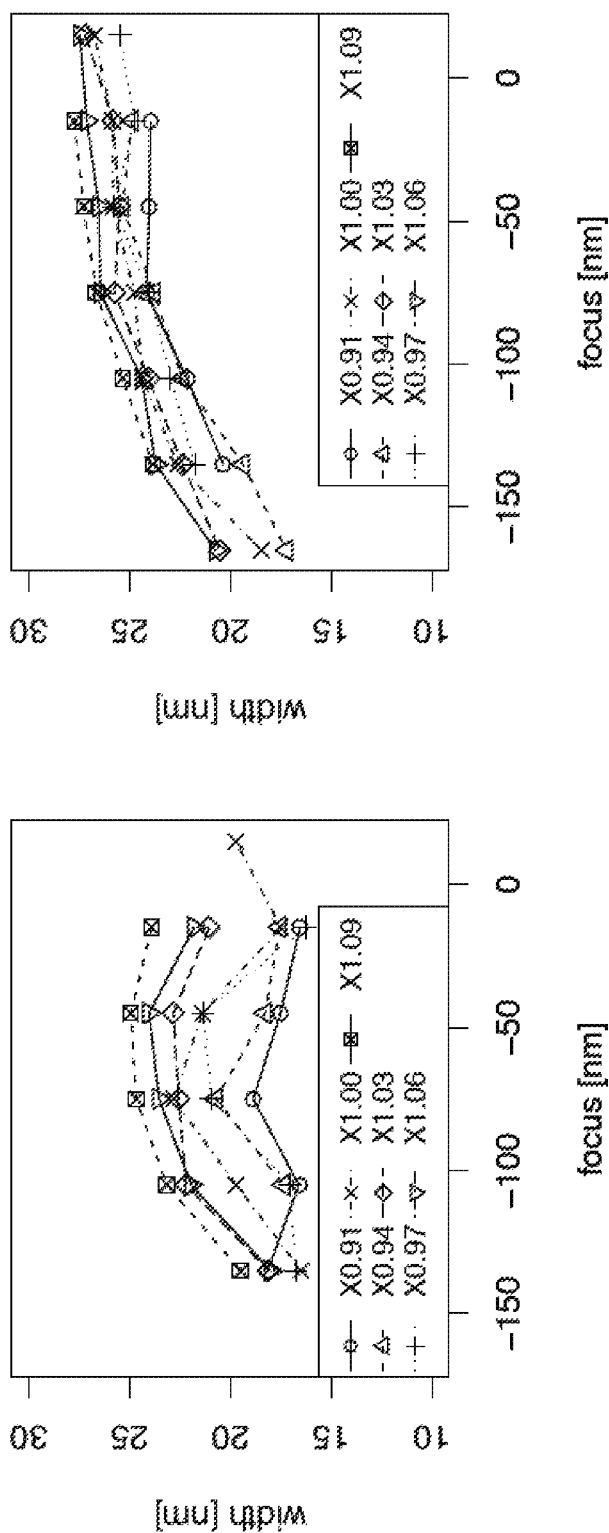
FIG. 6 is an example of the focus effects that this invention is trying to correct according to one embodiment of the present invention. On the left is the experimentally measured trenchwidth through focus for various incident doses, where the mask consists of only main features at a pitch of 288 nm, which prints at a pitch of 72 nm on the wafer. On the right side, assist features are added halfway between the main features, and the trenchwidth through focus is tilted, making it difficult to discern a best focus. This is not desired in a process because a positive focus error increases the trench width while a negative focus error has the opposite effect.

Referring to FIG. 6, this is a plot of trenchwidth versus focus for varying dose, or Bossung plot, on a wafer that was exposed with a 0.33 NA EUV scanner with a mask that had main features at 288 nm pitch in both cases, which are to be printed at 72 nm pitch on the wafer because the optics used a 4× demagnification. On the left side there are no assist features and the best focus is roughly in the center of the focus range at about −75 nm. Best focus is characterized as the point where there is negligible slope for the trenchwidth vs focus. On the right side, we plot the results from the same wafer with 72 nm pitch main features with assist features between them. The Bossung curve is sloped and there is no discernible best focus where the slope vanishes. This is due to the index mismatch between vacuum and absorber and this shift of best focus is what the invention is correcting.

EXAMPLE 2

Figure 7B:
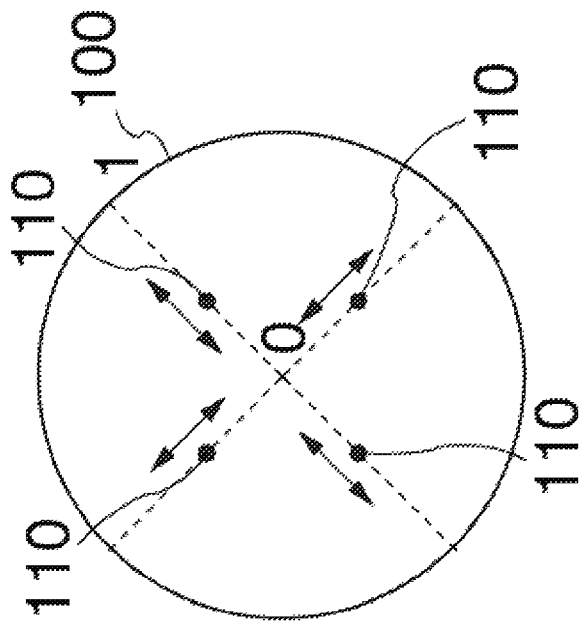
FIG. 7B shows the simulation setup that enables us to investigate the impact of various illuminator elements on the printing of the trenchwidth through focus according to one embodiment of the present invention. The quasar illuminator in FIG. 7A can be thought of as an illuminator that consists of many point sources that make up the shape of the illumination. By investigating such point sources that lie on the axis of illumination, as shown in FIG. 7B, we can understand the effect of the various illuminator regions on imaging.
Figure 7A:
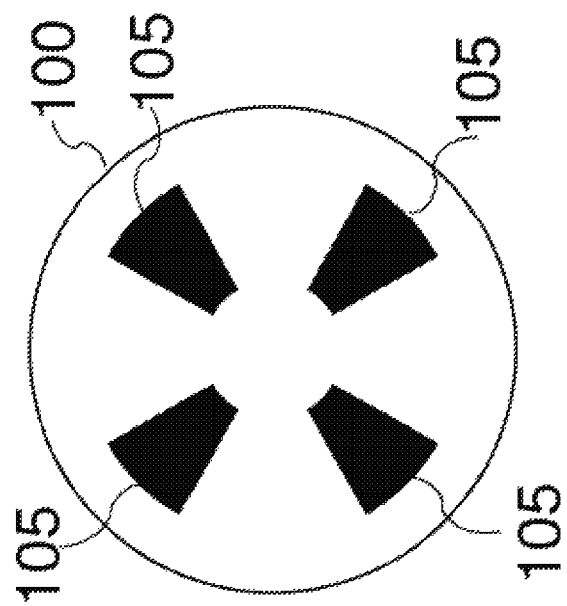
FIG. 7A shows a quasar illuminator.
Figure 8:
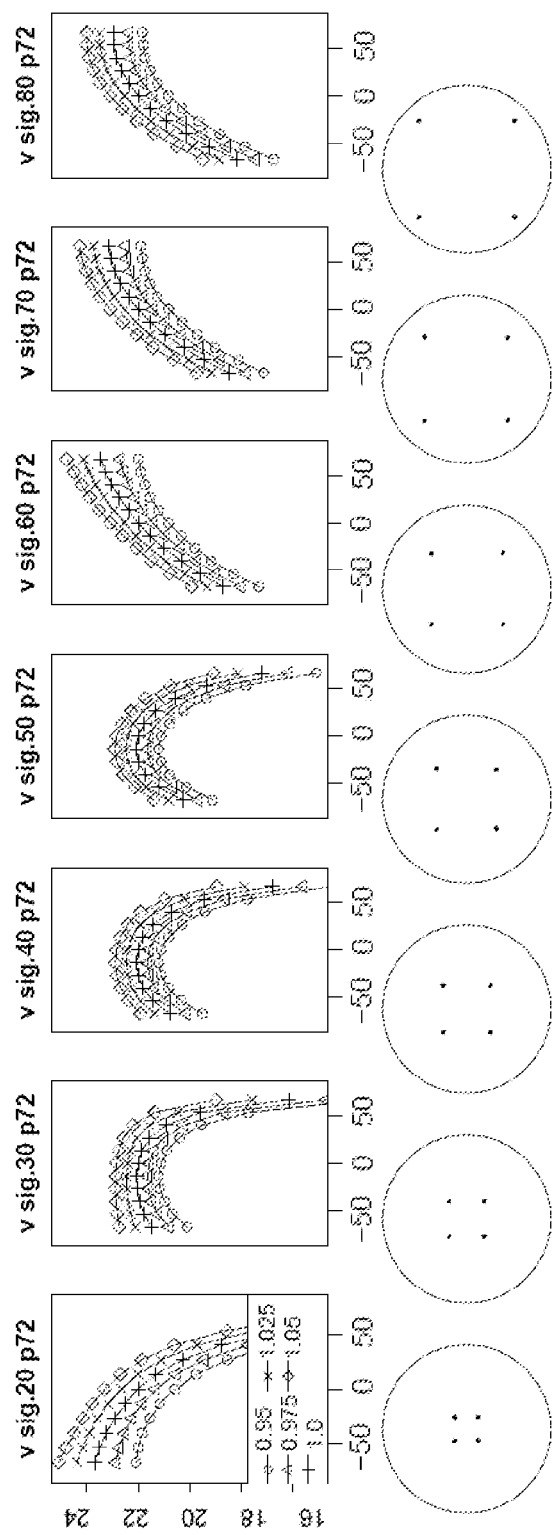
FIG. 8 shows simulations of trenchwidth through focus for five different doses of incident EUV light according to one embodiment of the present invention. Instead of the quasar illumination that is used in experiments and shown in FIG. 7A, we investigate point quasar illumination for different radius from the center of illumination as shown in FIG. 7B. We start with σ=0.2 on the very left and increase σ in steps of 0.1 up to 0.8 on the right.
Figure 9:
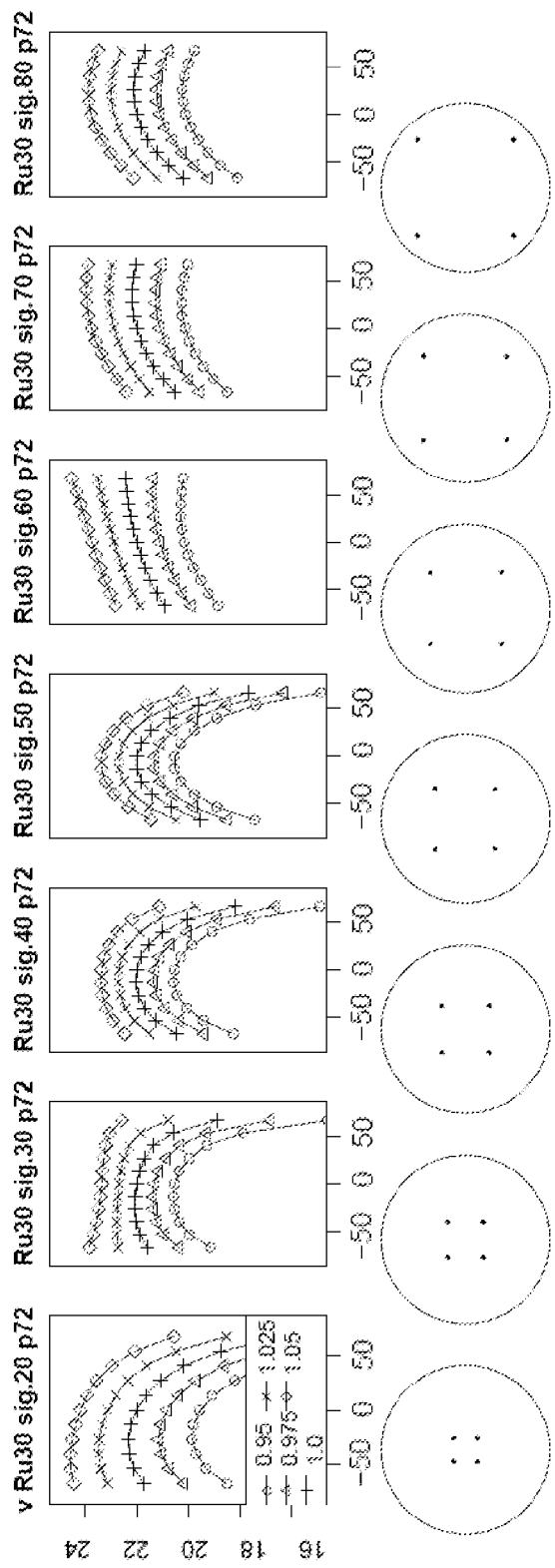
FIG. 9 shows simulations identical to FIG. 8, with the only exception that a continuous layer of Ru was deposited on the entire mask, as depicted as 95 in FIG. 3B according to one embodiment of the present invention. The Ru layer is 30 nm thick.
Figure 10:
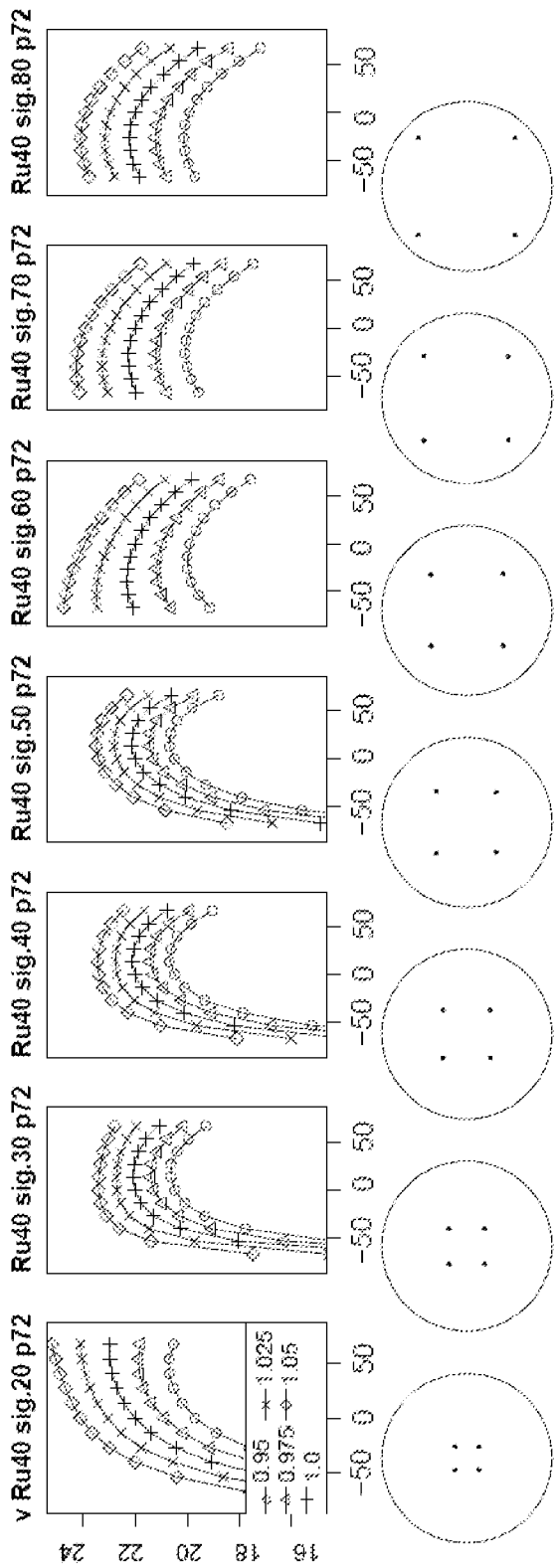
FIG. 10 shows simulations identical to FIG. 9, with the only exception that the layer of Ru is 40 nm thick according to one embodiment of the present invention.

FIG. 7A is a graphical representation of the quasar illumination that is typically used in high resolution lithography on the left, and FIG. 7B is a representation of the illumination that is used to investigate the various parts of this quasar illuminator in simulations whose results are shown in succeeding figures. The distance of an illuminator element from the center of illumination, represented as the center of the circle 100 in FIGS. 7A and 7B, is commonly denoted as σ (sigma), with σ=0 in the center and σ=1 at the edge of the circle. The representation of the quasar illuminator in FIG. 7A shows the angular distribution of the EUV light that is incident on the mask. The inner radius of the illumination in the experiments of FIG. 6 and simulations in FIGS. 8 through 10 is σ=0.37 and the outer radius is σ=0.88, which is a typical combination of inner and outer σ for printing a minimum pitch of 36 nm at a numerical aperture of 0.33 NA. If a different minimum pitch is required, the optimum σ values will be different. The circle 100 indicates the range of angles that, if part of the illumination, just fits into the aperture of the projection lens. The areas 105 indicated as black are the parts of the illuminator that shine light onto the mask in our experiments and simulations, and this shape of the illumination is known in the industry as quasar illumination. Each part of this quasar illuminator has a different effect on the linewidths on the wafer, and on the right side we indicate that we wish to investigate, via simulations, the effect of a group of four such point illuminators 110 with variable distance from the center of the pupil at 0, up to the maximum edge of the pupil at 1.

EXAMPLE 3

FIG. 8 shows the trenchwidth vs. focus behavior for five different doses in simulation for various point quadrupoles as defined in FIG. 7B. The EUV system has a demagnification factor of 4. On the mask is a main opening of approximately 4 times the target size of the trench on the wafer, roughly 80 nm, at a pitch of 288 nm, and an assist feature size of 40 nm. The simulations are then performed to print 22 nm trenchwidth at a pitch of 72 nm. In the 7 sequential columns of FIG. 8, the distance of the poles 110 from the center of the illumination system defined by the circle 100 is sigma of 0.2 up to 0.8 in steps of 0.1. For the quadrupole at sigma=0.2, we have a trenchwidth vs. focus curve that has a strong down slope, or a strongly negative best focus position. For the settings of sigma=0.3 through 0.5, we have close to a centered best focus, while for sigma values of 0.6 and above the best focus has moved to very positive values. The final image in resist is a superposition of those trenchwidth vs. focus curves, depending on a weighted average of the illumination system. Because in our experimental conditions the quasar illumination has an inner sigma of 0.37, none of the illumination elements with very negative best focus have an influence on the final image, while there are large parts of the illumination larger than sigma=0.5 which have a very positive best focus. This is the reason why the experimental best focus for the trenches with assist features on the right in FIG. 6 is so positive. This shift is due to a phase shift that is introduced in the assist features, which in turn is caused by the discontinuity in the real part of the refractive index between the Ta based absorber and the vacuum.

EXAMPLE 4

FIG. 9 shows simulations that are similar to the ones shown in FIG. 8, with the difference that a layer 95 of Ru with thickness 30 nm is deposited, as shown in FIG. 3B. For all σ values the best focus is closer to 0 than in FIG. 8, but a weighted superposition of results in σ values between 0.37 and 0.88 still shows a best focus that is slightly positive in simulations.

EXAMPLE 5

FIG. 10 shows the similar simulations as those of FIG. 9, with the difference that the Ru layer has a thickness of 40 nm. A weighted superposition of the trenchwidths in these simulations shows a best focus that is slightly negative in simulations.

What is claimed is:
1. An EUV mask for fixing phase effects comprising:
a mask substrate;
a multilayer reflector having a plurality of layers on the mask substrate, each layer having a thickness less than about 10 nm;
a mask pattern over the multilayer reflector, the mask pattern comprises absorptive regions and reflective regions, wherein the absorptive regions comprise an absorber having a thickness less than about 150 nm and the reflective regions comprise openings created inside the mask pattern, a first set of the openings having a width of equal to or less than about 60 nm; and
a phase shifter over the multilayer reflector, the phase shifter deposited inside the openings in all the reflective regions of the mask pattern to a thickness less than the thickness of the absorber, said thickness of the phase shifter capable of, during an EUV exposure process, correcting phase effects caused by a phase shift present on a mask.

2. The EUV mask of claim 1, wherein a value of a real part of a refractive index of the phase shifter is about equal to or less than a value of a real part of a refractive index of the absorber.
3. The EUV mask of claim 2, wherein the value of the real part of the refractive index of the phase shifter is less than about 0.95.
4. The EUV mask of claim 2, wherein the value of the real part of the refractive index of the phase shifter is less than about 0.93.
5. The EUV mask of claim 1, wherein the thickness of the phase shifter is determined by simulation based on at least the mask pattern, refractive index of the absorber, refractive index of the phase shifter and thickness of the absorber.
6. The EUV mask of claim 1, wherein the EUV mask further comprises a capping layer over the multilayer reflector, the phase shifter, or both.
7. The EUV mask of claim 1, wherein the mask pattern comprises a repeating pattern which comprises an assist feature, or a pattern which comprises two different sized features in close proximity.
8. The EUV mask of claim 7, wherein the repeating pattern of the EUV mask causes creation of a printed photoresist pattern through an EUV exposure process on a photoresist layer, the printed photoresist pattern is selected from a group consisting of lines, trenches, holes, studs, and mixtures thereof.
9. The EUV mask of claim 7, wherein the repeating pattern of the EUV mask causes creation of a printed photoresist pattern through an EUV exposure process on a photoresist layer, the printed photoresist pattern is trenches for positive photoresist or lines for negative photoresist.
10. The EUV mask of claim 7, wherein the assist feature has a linewidth in a range from about 20 nm to about 60 nm.
11. The EUV mask of claim 1, wherein the absorptive region further comprises the phase shifter over the absorber.
12. The EUV mask of claim 1, wherein the absorber comprises tantalum.
13. The EUV mask of claim 1, wherein material of the phase shifter is selected from a group consisting of V, Nb, Mo, Tc, Rh, Ru, and mixtures thereof.
14. A method of making an EUV mask for fixing phase effects comprising:
providing a mask substrate;
forming a multilayer reflector having a plurality of layers on the mask substrate, each layer having a thickness less than about 10 nm;
forming an absorber layer having a thickness less than about 150 nm on the multilayer reflector;
selectively etching the absorber layer to form a mask pattern which comprises absorptive regions and reflective regions, wherein the reflective regions are regions where the absorber layer is etched away to form openings and the absorptive regions are regions where the absorber layer is not etched, a first set of the openings having a width of equal to or less than about 60 nm; and
depositing a phase shifter layer to cover at least all the reflective regions of the mask pattern to a thickness less than the thickness of the absorber layer, said thickness of the phase shifter layer capable of, during an EUV exposure process, correcting phase effects caused by a phase shift present on a mask.
15. The method of claim 14, wherein after forming the multilayer reflector and before forming the absorber layer further comprising a step of forming a capping layer on the multilayer reflector.

16. The method of claim 14, wherein after depositing the phase shifter layer further comprising a step of forming a capping layer on the phase shifter layer.

17. The method of claim 14, wherein a value of a real part of a refractive index of the phase shifter is about equal to or less than a value of a real part of a refractive index of the absorber layer.

18. The method of claim 14, wherein the mask pattern comprises a repeating pattern which comprises an assist feature, or a pattern which comprises two different sized features in close proximity.

19. The method of claim 18, wherein the repeating pattern of the EUV mask causes creation of a printed photoresist pattern through an EUV exposure process on a photoresist layer, the printed photoresist pattern is selected from a group consisting of lines, trenches, holes, studs, and mixtures thereof.

20. The method of claim 14, wherein the thickness of the phase shifter layer is determined by simulation based on at least the mask pattern, refractive index of the absorber, refractive index of the phase shifter and thickness of the absorber.

\* \* \* \* \*